US009351404B2

(12) United States Patent
Satake

(10) Patent No.: US 9,351,404 B2
(45) Date of Patent: May 24, 2016

(54) ELECTRONIC DEVICE
(75) Inventor: Hirotaka Satake, Tottori (JP)
(73) Assignee: HITACHI METALS, LTD., Tokyo (JP)
( * ) Notice: Subject to any disclaimer, the term of this patent is extended or adjusted under 35 U.S.C. 154(b) by 130 days.
(21) Appl. No.: 13/989,292
(22) PCT Filed: Nov. 21, 2011
(86) PCT No.: PCT/JP2011/076821
§ 371 (c)(1),
(2), (4) Date: May 23, 2013
(87) PCT Pub. No.: WO2012/070540
PCT Pub. Date: May 31, 2012
(65) Prior Publication Data
US 2013/0250536 A1 Sep. 26, 2013
(30) Foreign Application Priority Data
Nov. 24, 2010 (JP) ................. 2010-260995
(51) Int. Cl.
H05K 1/18 (2006.01)
H01P 1/20 (2006.01)
(Continued)
(52) U.S. Cl.
CPC .............. *H05K 1/181* (2013.01); *H01L 23/552* (2013.01); *H01L 23/66* (2013.01); *H01P 1/20345* (2013.01); *H03F 3/195* (2013.01); *H03F 3/24* (2013.01); *H03F 3/245* (2013.01); *H03F 3/60* (2013.01); *H01L 23/3677* (2013.01); *H01L 23/49822* (2013.01); *H01L 23/49827* (2013.01); *H01L 23/50* (2013.01); *H01L 24/32* (2013.01); *H01L 24/48* (2013.01); *H01L 24/73* (2013.01); *H01L 2224/32225* (2013.01);
(Continued)

(58) Field of Classification Search
CPC .................................................. H01P 1/20345
USPC .......................................................... 333/247
See application file for complete search history.

(56) References Cited
U.S. PATENT DOCUMENTS
7,978,031 B2 7/2011 Goi et al.
2006/0110859 A1* 5/2006 Shigemura et al. ........... 438/125
(Continued)

FOREIGN PATENT DOCUMENTS
JP 09-116091 A 5/1997
JP 2007-295327 A 11/2007
JP 2009-182903 A 8/2009

Primary Examiner — Jeremy C Norris
Assistant Examiner — Nathan Milakovich
(74) Attorney, Agent, or Firm — Sughrue Mion, PLLC

(57) ABSTRACT

An electronic device comprising a laminate comprising pluralities of insulator layers each provided with conductor patterns, and an amplifier-constituting semiconductor device mounted to a mounting electrode formed on an upper surface of the laminate, a first ground electrode being formed on an insulator layer near an upper surface of the laminate; a second ground electrode being formed on an insulator layer near a lower surface of the laminate; the first ground electrode being connected to the mounting electrode through pluralities of via-holes; conductor patterns constituting the first circuit block being disposed in a region below the amplifier-constituting semiconductor device between the first ground electrode and the second ground electrode; and at least part of a conductor pattern for a line connecting the first circuit block to the amplifier-constituting semiconductor device being disposed on an insulator layer sandwiched by the mounting electrode and the first ground electrode.

7 Claims, 9 Drawing Sheets

(51) Int. Cl.
  *H01P 1/203* (2006.01)
  *H01L 23/552* (2006.01)
  *H01L 23/66* (2006.01)
  *H03F 3/24* (2006.01)
  *H03F 3/60* (2006.01)
  *H03F 3/195* (2006.01)
  *H01L 23/367* (2006.01)
  *H01L 23/498* (2006.01)
  *H01L 23/50* (2006.01)
  *H01L 23/00* (2006.01)

(52) U.S. Cl.
  CPC ............ *H01L 2224/48227* (2013.01); *H01L 2224/48235* (2013.01); *H01L 2224/73265* (2013.01); *H01L 2924/142* (2013.01); *H01L 2924/19051* (2013.01); *H01L 2924/19105* (2013.01); *H01L 2924/3011* (2013.01); *H01L 2924/3025* (2013.01); *H03F 2200/06* (2013.01); *H03F 2200/09* (2013.01); *H03F 2200/165* (2013.01); *H03F 2200/171* (2013.01); *H03F 2200/294* (2013.01); *H03F 2200/534* (2013.01); *H03F 2200/541* (2013.01)

(56) References Cited

U.S. PATENT DOCUMENTS

| | | | |
|---|---|---|---|
| 2007/0076392 A1* | 4/2007 | Urashima et al. | 361/763 |
| 2008/0166980 A1 | 7/2008 | Fukamachi et al. | |
| 2009/0195334 A1* | 8/2009 | Goi et al. | 333/203 |
| 2010/0214037 A1* | 8/2010 | Plager | H01P 1/20345 333/185 |
| 2011/0279197 A1* | 11/2011 | Kameya | H01P 1/20345 333/185 |

* cited by examiner

ELECTRONIC DEVICE

CROSS REFERENCE TO RELATED APPLICATIONS

This application is a National Stage of International Application No. PCT/JP2011/076821, filed on Nov. 21, 2011 (claiming priority from Japanese Patent Application No. 2010-260995, filed Nov. 24, 2010), the contents of which are incorporated herein by reference in their entirety.

FIELD OF THE INVENTION

The present invention relates to a small electronic device comprising an amplifier-constituting semiconductor device and high-frequency circuits such as filters, etc., which is suitable for wireless communications apparatuses.

BACKGROUND OF THE INVENTION

FIG. 13 shows a high-frequency circuit of a wireless communications apparatus for wireless LAN (local area network). This high-frequency circuit comprises a high-frequency switch SW for switching the connection of an antenna ANT to a transmitting circuit TX and a receiving circuit RX; a filter FIL2, an amplifier PA, a filter FIL1 and a balun BAL1 disposed in this order from the antenna ANT in a path for passing transmission signals having a frequency f1; and a filter FIL4, a low-noise amplifier LNA, a filter FIL3 and a balun BAL2 disposed in this order from the antenna ANT in a path for passing receiving signals having a frequency f2.

Wireless communications apparatuses such as mobile phones, etc. have been made smaller remarkably, resulting in rapidly miniaturized high-frequency circuits and electronic devices used therein. As an example of the miniaturization of electronic devices, JP 09-116091 A discloses, as shown in FIG. 14, a hybrid integrated circuit device 1000 comprising a multilayer substrate 1120, and parts such as an amplifier-constituting semiconductor device 1550, etc., which are mounted on the multilayer substrate 1120. The amplifier-constituting semiconductor device 1550 is soldered to a mounting electrode 1050 in a cavity of the multilayer substrate 1120, connected to terminal electrodes 1300 on an upper surface of the multilayer substrate 1120 via bonding wires 1600, and sealed by a resin 1540. Devices 1500, 1510 such as reactance devices, resistors, etc. are mounted on the upper surface of the multilayer substrate 1120, and covered with a metal cap 2000. Conductor lines 1200, etc. are formed on insulator layers in the multilayer substrate 1120, and connected to the mounted devices 1500, 1510 through via-holes 1310 and connecting lines. Pluralities of thermal vias 1010 are disposed in an entire region below the amplifier-constituting semiconductor device 1550. The thermal vias 1010 are connected to the mounting electrode 1050, and a ground electrode 1100 formed on a lower surface of the multilayer substrate 1120.

Because the thermal vias 1010 indispensable for removing heat generated by the amplifier-constituting semiconductor device 1550 occupy most part of a region below the amplifier-constituting semiconductor device 1550 as shown in FIG. 14, other circuits cannot be disposed in this region, hindering the miniaturization of the electronic device.

On the other hand, in a high-frequency module (electronic device) 2000 disclosed in JP 2009-182903 A, as shown in FIG. 15, a power amplifier IC (amplifier-constituting semiconductor device) 2550 is mounted on an upper surface of a multilayer substrate 2120, and a filter 2180 formed on insulator layers in the multilayer substrate 2120 is disposed immediately below the power amplifier IC 2550. Thermal vias 2030 for the power amplifier are constituted by a large number of ground via-holes. Unlike the thermal vias 1010 in JP 09-116091 A, this structure makes the connection of the mounting electrode 1050 on the upper surface to the ground electrode 1100 on the lower surface unnecessary, resulting in a reduced number of via-holes, and thus enabling a high-frequency module to be smaller.

The arrangement of a filter below an amplifier-constituting semiconductor device as in JP 2009-182903 A would make a high-frequency module smaller. However, because a usual filter has an input port and an output port separate from each other, a relatively long wiring pattern is needed to connect the filter to an input port of an amplifier-constituting semiconductor device. A longer wiring pattern provides larger parasitic reactance by itself and by interference with other conductor patterns.

In JP 2009-182903 A, the above wiring pattern is formed on the same layer as that for conductor patterns constituting an interdigital λ/4 resonator in a region below the amplifier-constituting semiconductor device, such that it makes a detour around the conductor pattern. Also, tri-plate striplines constituted by ground patterns for the wiring pattern are connected to a chip capacitor mounted on the multilayer substrate through via-holes. Because ground patterns only for the wiring pattern are formed to make a detour around the conductor pattern, there is no enough area for forming resonator-constituting conductor patterns, despite reduced loss by such structure. In addition, an inevitably long wiring pattern provides large loss.

OBJECT OF THE INVENTION

Accordingly, an object of the present invention is to provide a small electronic device having excellent electric characteristics, while preventing the deterioration of electric characteristics due to the connection of circuit blocks to an amplifier-constituting semiconductor device.

SUMMARY OF THE INVENTION

The electronic device of the present invention comprises a laminate comprising pluralities of insulator layers each provided with conductor patterns, and an amplifier-constituting semiconductor device mounted to a mounting electrode formed on an upper surface of the laminate, a first ground electrode being formed on an insulator layer near an upper surface of the laminate;
a second ground electrode being formed on an insulator layer near a lower surface of the laminate;
the first ground electrode being connected to the mounting electrode through pluralities of via-holes;
conductor patterns constituting a first circuit block being disposed in a region below the amplifier-constituting semiconductor device between the first ground electrode and the second ground electrode, and
at least part of a conductor pattern for a line connecting the first circuit block to the amplifier-constituting semiconductor device being disposed on an insulator layer sandwiched by the mounting electrode and the first ground electrode.

Because the conductor pattern for a line connecting the first circuit block to the amplifier-constituting semiconductor device is vertically sandwiched by the mounting electrode and the first ground electrode, it is electromagnetically shielded and thus protected from interference.

The conductor pattern for the connecting line is preferably a stripline connected to a via-hole connected to an output end of the first circuit block and a via-hole connected to the terminal electrode connected to the amplifier-constituting semiconductor device.

The via-holes are preferably formed around the conductor pattern for the connecting line. This structure can further reduce electromagnetic interference.

Conductor patterns for power-supplying lines connected to the amplifier-constituting semiconductor device are preferably formed on at least one of an insulator layer above the first ground electrode and an insulator layer below the second ground electrode. This structure further reduces interference between conductor patterns for lines for supplying power to the amplifier-constituting semiconductor device and conductor patterns for the first circuit block.

When the conductor patterns for lines for supplying power to the semiconductor device are disposed above the first ground electrode, conductor patterns for the power-supplying lines preferably do not overlap the conductor pattern for the line connecting the first circuit block to the amplifier-constituting semiconductor device in a lamination direction. Also, when conductor patterns for the power-supplying lines and the conductor pattern for the connecting line are extending in the same direction on the same insulator layer, or when they are close on different insulator layers, via-holes connecting the first ground electrode to the mounting electrode are preferably formed between them.

The laminate preferably has a third ground electrode on the lower surface, the third ground electrode being connected to the second ground electrode through pluralities of via-holes. This structure stabilizes the potential of the second ground electrode (ground potential). Because the second ground electrode is connected to both of the first ground electrode and the mounting electrode through pluralities of via-holes, the ground potential of the first ground electrode and the mounting electrode is stabilized.

It is preferable that insulator layers between the mounting electrode and the third ground electrode in the laminate are provided with pluralities of via-holes connected in a lamination direction and arranged linearly in an in-plane direction, and that one or more shields constituted by linearly arranged via-holes partition the inside of the laminate to at least two regions between the first ground electrode and the second ground electrode. Shields between the regions reduce electromagnetic interference.

Such shield acts as a path for dissipating heat generated from an amplifier-constituting semiconductor device to the third ground electrode (first heat-dissipating path). The shield is preferably disposed on the signal output side of the amplifier-constituting semiconductor device. To enhance heat dissipation, the shield may be formed by plural lines of via-holes, and via-holes for the shield may have larger inner diameters than those of via-holes for passing high-frequency signals.

In addition to the first shield, a second shield may be formed by via-holes arranged linearly to connect the first ground electrode to the second ground electrode in a lamination direction. The second shield acts as a second heat-dissipating path for enhancing heat dissipation. The second heat-dissipating path is constituted by pluralities of via-holes connecting the mounting electrodes to the first ground electrode, pluralities of via-holes connecting the second ground electrode to the third ground electrode, and the second shield.

DESCRIPTION OF THE PREFERRED EMBODIMENTS

Figure 1:
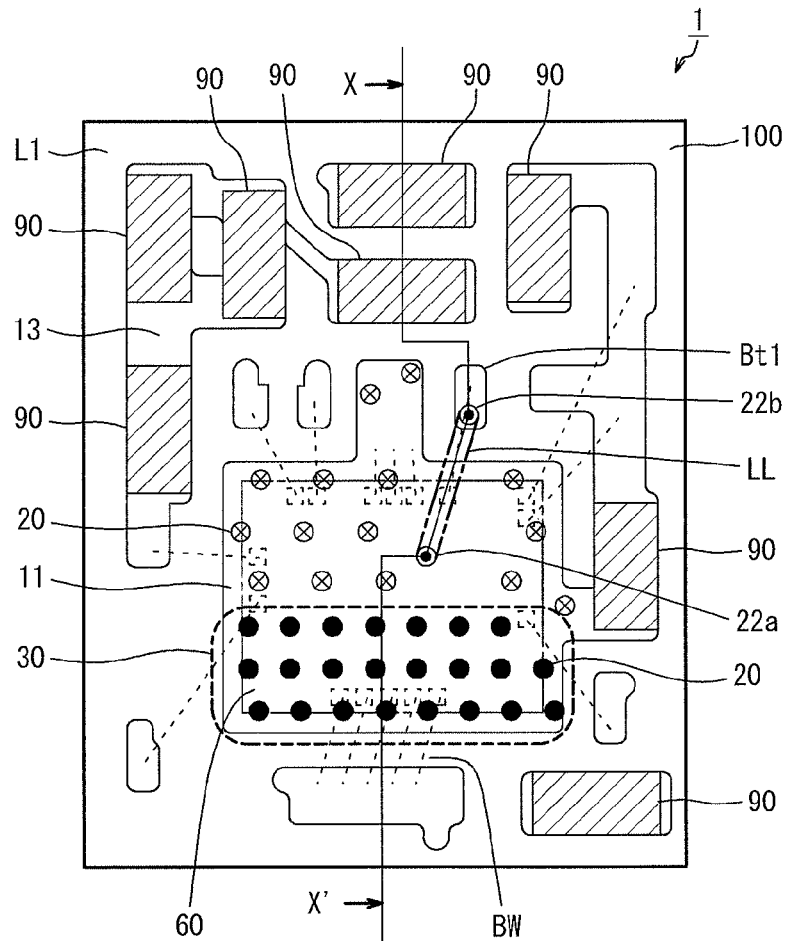
FIG. 1 is a plan view showing an electronic device according to one embodiment of the present invention.

The embodiments of the present invention will be explained in detail referring to the attached drawings, and explanations on one embodiment are applicable to other embodiments unless otherwise mentioned. Also, explanations below are not restrictive, but may be modified variously within the technological concept of the present invention.

[1] First Embodiment

FIGS. 1-7 show an electronic device 1 according to the first embodiment of the present invention. Although insulator layers L1-L4 shown in FIGS. 1 and 3-5 are indispensable layers, the electronic device 1 of the present invention comprises other insulator layers, too. Accordingly, insulator layers with consecutive reference numerals are not necessarily adjacent to each other. For example, other insulator layers may exist between an insulator layer L3 shown in FIG. 4 and an insulator layer L4 shown in FIG. 5.

This electronic device 1 comprises a laminate 100 comprising pluralities of insulator layers each provided with conductor patterns, and an amplifier-constituting semiconductor device 60 mounted to a mounting electrode 11 on an upper surface of the laminate 100, a first ground electrode 10a being formed on an insulator layer near an upper surface of the laminate 100;

a second ground electrode 10b being formed on an insulator layer near a lower surface of the laminate 100;

the first ground electrode 10a being connected to the mounting electrode 11 through pluralities of via-holes 20;

conductor patterns constituting a first circuit block 70 being disposed in a region below the amplifier-constituting semiconductor device 60 between the first ground electrode 10a and the second ground electrode 10b; and at least part of a conductor pattern for a line connecting the first circuit block 70 to the amplifier-constituting semiconductor device 60 being disposed on an insulator layer L2 sandwiched by the mounting electrode 11 and the first ground electrode 10a.

As shown in FIG. 1, an upper surface (surface of the uppermost insulator layer L1) of the laminate 100 constituting the electronic device 1 of the present invention is provided with an electrode 11 for mounting the amplifier-constituting semiconductor device 60, and terminal electrodes 13 for mounting chip devices 90. An upper surface of the laminate 100 is also provided with a terminal electrode Bt1 connected to the amplifier-constituting semiconductor device 60 adjacently to the mounting electrode 11. Pluralities of via-holes 20 (shown by black circles and circles with X) are formed in substantially the entire surface of the mounting electrode 11. An upper surface of the amplifier-constituting semiconductor device 60 soldered to the mounting electrode 11 is provided with an input terminal P1a at a position close to the terminal electrode Bt1, and the input terminal P1a is connected to the terminal electrode Bt1 by a bonding wire BW.

Figure 4:
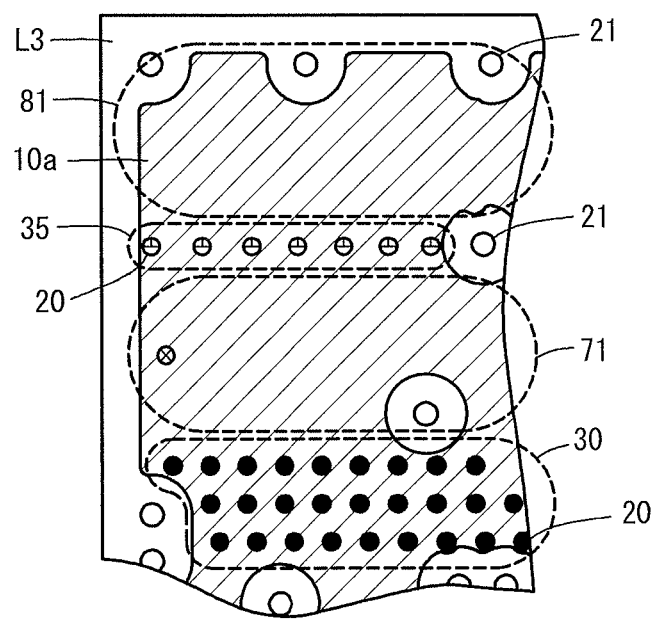
FIG. 4 is a partial plan view showing an insulator layer provided with the first ground electrode in the laminate constituting the electronic device according to one embodiment of the present invention.

The first ground electrode 10a is formed on an insulator layer near an upper surface of the laminate 100, and the second ground electrode 10b is formed on an insulator layer near the lower surface. As shown in FIG. 4, each of the first and second ground electrodes 10a, 10b is formed by a conductor pattern covering a substantially entire surface of the insulator layer, except for portions around via-holes 21 and conductor patterns to prevent parasitic capacitance. In a region between the first and second ground electrodes 10a, 10b in the laminate 100, conductor patterns for the first circuit block 70 are formed.

Figure 2:
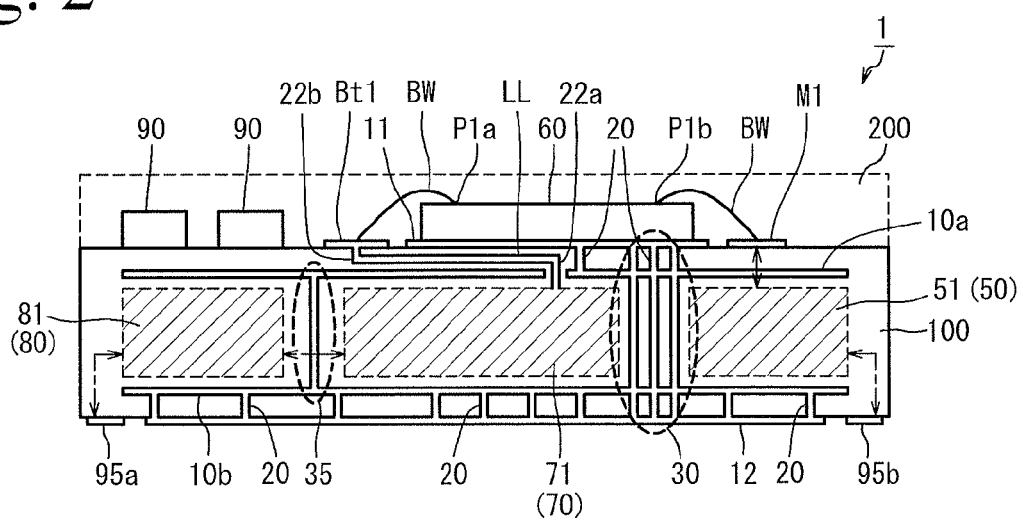
FIG. 2 is a cross-sectional view taken along the line X-X' in FIG. 1.
Figure 3:
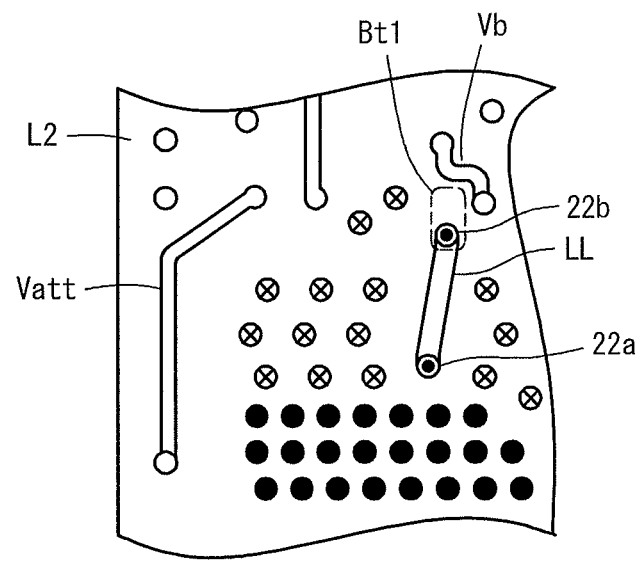
FIG. 3 is a partial plan view showing conductor patterns and via-holes formed on an insulator layer between the upper surface and the first ground electrode in the laminate constituting the electronic device according to one embodiment of the present invention.

As shown in FIGS. 2 and 3, a substantially straight conductor pattern LL extending on an insulator layer L2 between the upper surface (uppermost insulator layer L1) of the laminate 100 and the first ground electrode 10a is constituted by a stripline connected to a via-hole 22a connected to an output end of the first circuit block (filter) 70, and a via-hole 22b connected to the terminal electrode Bt1 (connected to the amplifier-constituting semiconductor device 60). Because the conductor pattern LL between the mounting electrode 11 and the first ground electrode 10a is connected to the first circuit block 70 and the terminal electrode Bt1 through via-holes 22a, 22b in a lamination direction, connection between the terminal electrode Bt1 and the first circuit block 70 can be short. The conductor pattern LL sandwiched by the mounting electrode 11 having ground potential and the first ground electrode 10a has characteristic impedance lower than the normalized impedance. However, because impedance on the output side of the conductor pattern LL can be optimized by properly designing the first circuit block 70 including the conductor pattern LL, the deterioration of high-frequency characteristics can be prevented.

As shown in FIG. 3, a conductor pattern Vb for control signals may be provided at a position close to the conductor pattern LL. To avoid interference, the conductor pattern Vb preferably does not overlap the terminal electrode Bt1 in a lamination direction. As shown in FIGS. 1 and 3, the arrangement of via-holes 20 (shown by circles with X in the figure) connecting the mounting electrode 11 to the first ground electrode 10a around the conductor pattern LL further reduces influence by noises.

The terminal electrode Bt1 connected to the first circuit block 70 via the conductor pattern LL is connected to the input terminal P1a of the amplifier-constituting semiconductor device 60 by pluralities of bonding wires BW. The output terminal P1b of the amplifier-constituting semiconductor device 60 is connected to the terminal electrode M1 on the upper surface by pluralities of bonding wires BW, and the terminal electrode M1 is connected to terminal electrodes 95 on the lower right side via a second circuit block 50.

A lower surface of the laminate 100 is provided with terminal electrodes 95 for mounting to a circuit board, and a third ground electrode 12 connected to the second ground electrode 10b through pluralities of via-holes 20. The third ground electrode 12 is formed by a conductor pattern covering a large region including a center portion of the lower surface of the laminate 100. The terminal electrodes 95 for mounting to the circuit board are formed around the third ground electrode 12. The terminal electrodes 95 function as input/output ports P1, P2+, P2−, ground ports, power supply ports Vcc1, Vcc2, Vatt, Vb, VVd, etc. The input/output terminal P1 is an unbalanced terminal, and the input/output terminals P2+, P2− are balanced terminals. Terminal electrodes on the lower surface of the laminate 100 are in a land grid array (LGA), though they may be in a ball grid array (BGA). The terminal electrodes may be formed on side surfaces of the laminate 100.

Part of the via-holes 20 filled with a metal conductor extend from the mounting electrode 11 to the third ground electrode 12 via the first and second ground electrodes 10a, 10b in a lamination direction, constituting a first shield 30. In the example shown in FIG. 1, the first shield 30 is constituted by pluralities of via-holes 20 (shown by black circles) arranged in three lines. The first shield 30 is formed in a region below the signal output side of the amplifier-constituting semiconductor device 60, which is not more than ½ of the area of the mounting electrode 11. Because the signal output side of the amplifier-constituting semiconductor device 60 is subject to higher temperatures than those of other portions, the first shield 30 in a region below the signal output side acts to dissipate heat from the amplifier-constituting semiconductor device 60 to a circuit board by thermal conduction.

Figure 5:
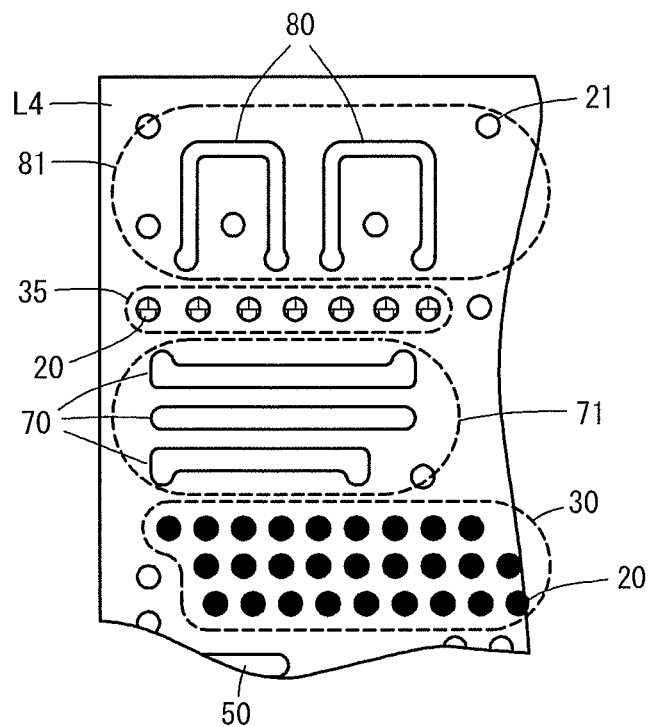
FIG. 5 is a partial plan view showing conductor patterns and via-holes formed on insulator layers between the first and second ground electrodes in the laminate constituting the electronic device according to one embodiment of the present invention.

The electronic device 1 further comprises a second shield 35 connecting the first ground electrode 10a to the second ground electrode 10b. Like the first shield 30, the second shield 35 is constituted by via-holes 20 extending in a lamination direction and arranged linearly. The second shield 35 is arranged at a position separate from the first shield 30, so that it does not overlap the amplifier-constituting semiconductor device 60 in a lamination direction. They are substantially parallel in the depicted example, though not restrictive. The first and second shields 30, 35 need not be straight. In FIGS. 4 and 5, the via-holes 20 constituting the first shield 30 are shown by black circles, the via-holes 20 constituting the second shield 35 are shown by circles with lattice, and other via-holes 21 constituting transmission paths for high-frequency signals and semiconductor-controlling signals, etc. are shown by white circles.

The laminate 100 is partitioned to at least three regions (first to third regions 71, 51, 81) by the first and second shields 30, 35 and the first and second ground electrodes 10a, 10b. The regions 51, 71, 81 are electromagnetically separated by the first and second shields 30, 35 and the first and second ground electrodes 10a, 10b. The first region 71 sandwiched by the first shield 30 and the second shield 35 between the first and second ground electrodes 10a, 10b is positioned in a region below the mounting electrode 11, and conductor patterns constituting the first circuit block 70 are disposed therein. In the second region 51 defined by the first shield 30 and the first and second ground electrodes 10a, 10b, conductor patterns constituting the second circuit block 50 are disposed. In the third region 81 defined by the second shield 35 and the first and second ground electrodes 10a, 10b, conductor patterns constituting the third circuit block 80 are disposed.

Figure 6:
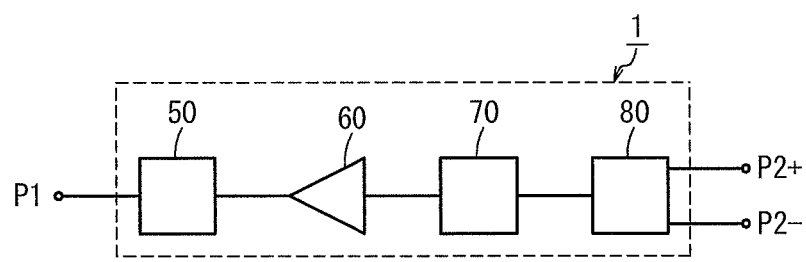
FIG. 6 is a block diagram showing a circuit constituting the electronic device according to one embodiment of the present invention.
Figure 7:
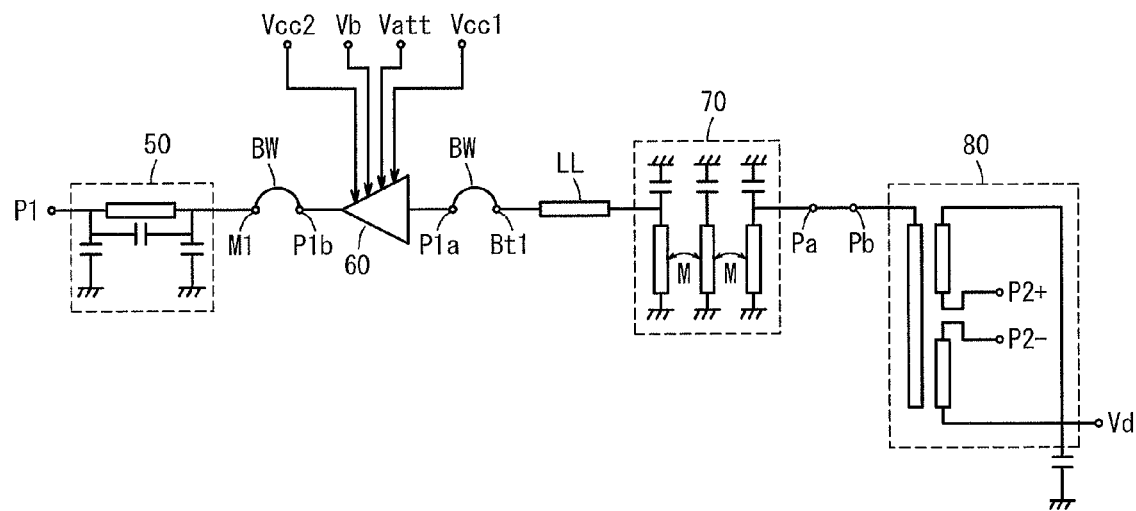
FIG. 7 is a view showing the equivalent circuit of the circuit of FIG. 6.

In this embodiment, as shown in FIGS. 5-7, the first circuit block 70 disposed in the first region 71 is a bandpass filter, the second circuit block 50 disposed in the second region 51 is a lowpass filter, and the third circuit block 80 disposed in the third region 81 is a balun. Though not restrictive, a filter and a matching circuit are preferably arranged on the output side of the amplifier-constituting semiconductor device 60, with a filter, a balun or a filter balun arranged on the input side.

In FIG. 2, connections between the circuit blocks 50, 70, 80, and their connections to terminal electrodes on the upper and lower surfaces of the laminate 100 are schematically shown by arrows. These connections are made through via-holes and conductor patterns (not shown), etc. Specifically, a terminal electrode 95a on the lower left side in FIG. 2 is connected to the third circuit block 80, which is connected to the first circuit block 70. The first and third circuit blocks 70, 80 may be connected through connecting means in the laminate 100, or through another circuit block such as a filter, etc. disposed on the circuit board outside the laminate 100.

With power-supplying lines connected to the power supply terminals Vcc1, Vcc2, Vatt, Vb, Vd, and power-supplying lines connected to the amplifier-constituting semiconductor device 60 and the balun 80 formed on insulator layers between the first ground electrode 10a and the upper surface of the laminate 100 or between the second ground electrode 10b and the lower surface of the laminate 100, interference between the circuit blocks 50, 70, 80, and interference between the circuit blocks 50, 70, 80 and the circuit board, mounted devices and the power-supplying lines can be suppressed.

Heat generated from the amplifier-constituting semiconductor device 60 is dissipated to the circuit board mainly through the first shield 30, and partially through the second shield 35. Thus, the first shield 30 is called a main path for heat dissipation of the amplifier-constituting semiconductor device 60, and the second shield 35 is called a sub-path for heat dissipation of the amplifier-constituting semiconductor device 60. Because both first and second shields 30, 35 are constituted by via-holes arranged densely and linearly, efficient thermal conduction from the terminal electrode 11 to the circuit board can be achieved through the first to third ground electrodes 10a, 10b, 12.

[2] Second Embodiment

FIGS. 8-12 show an electronic device 1 according to the second embodiment of the present invention. This electronic device 1 is used in a high-frequency transmission/reception circuit in a wireless communications apparatus for wireless LAN, comprising pluralities of filters and baluns, and a high-frequency amplifier, a low-noise amplifier and a high-frequency switch mounted on a laminate.

Figure 8:
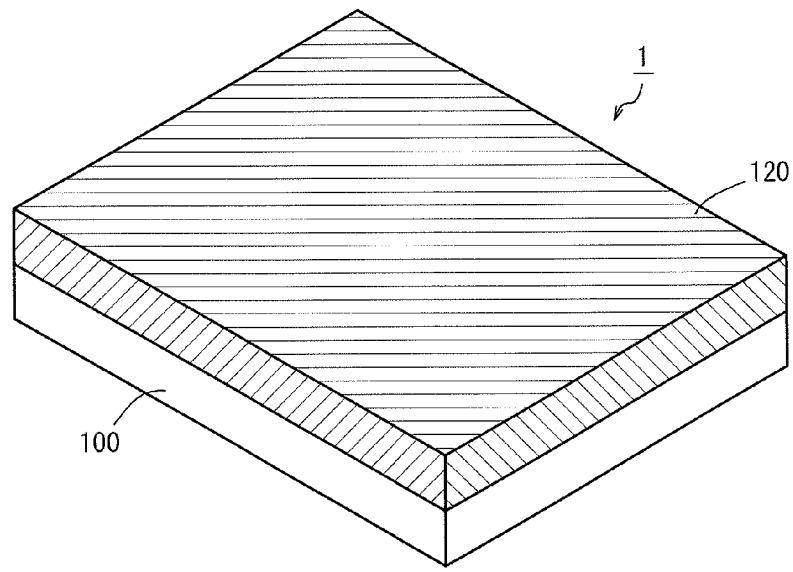
FIG. 8 is a perspective view showing the appearance of an electronic device according to another embodiment of the present invention.
Figure 9:
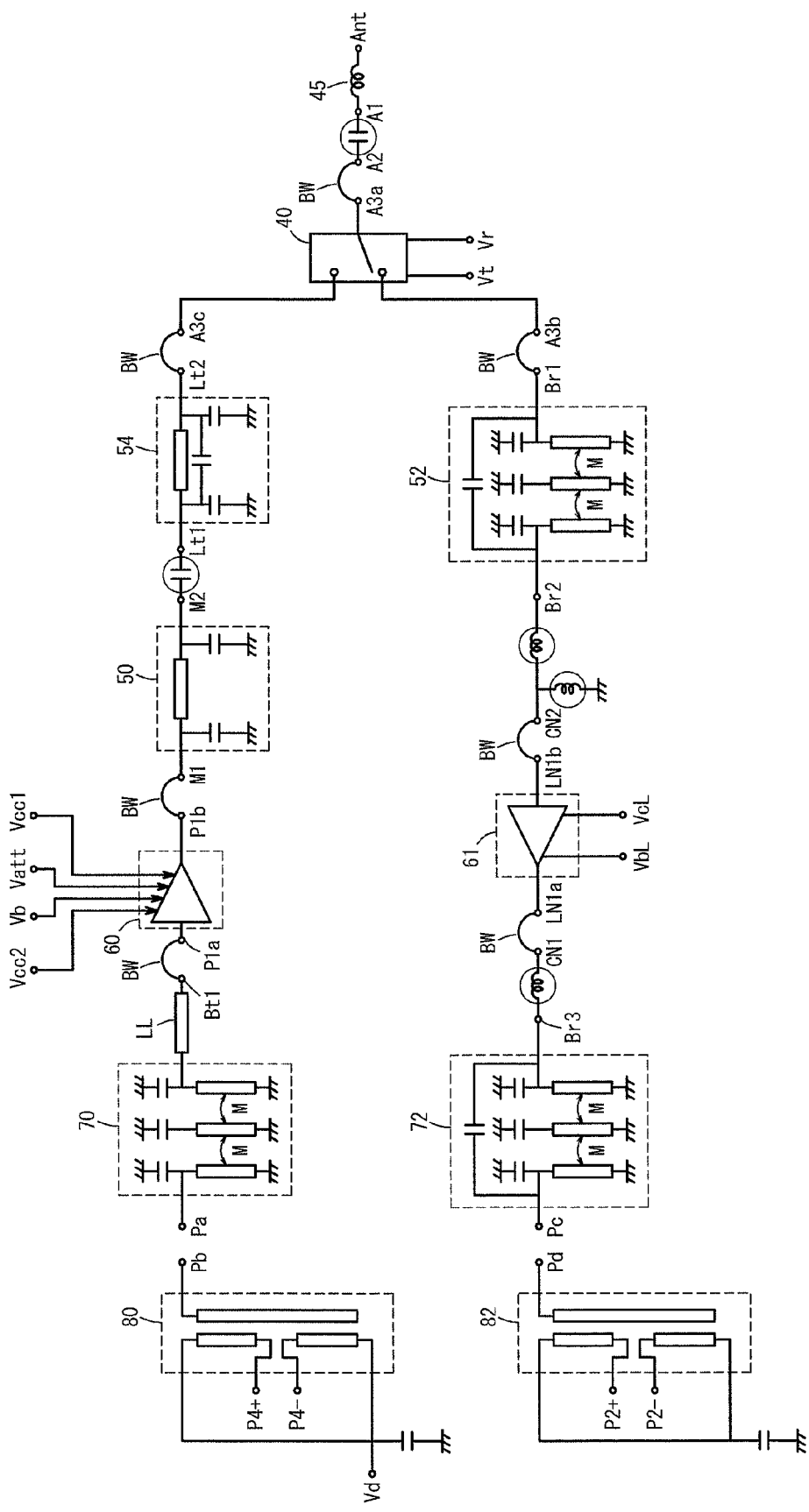
FIG. 9 is a view showing the equivalent circuit of the electronic device according to another embodiment of the present invention.

FIG. 9 shows an equivalent circuit of the electronic device 1. An antenna port ANT is connected via a matching circuit 45 to a single-pole double-throw (SPDT), high-frequency switch 40, to which a transmission signal path and a receiving signal path are connected, a balun 80, a filter 70, a high-frequency amplifier 60, a matching circuit 50 and a filter 54 being disposed in the transmission signal path, and a balun 82, a filter 72, a low-noise amplifier 61 and a filter 52 being disposed in the receiving signal path. Semiconductor devices constituting the high-frequency switch 40, the high-frequency amplifier 60, and the low-noise amplifier 61 are mounted on the laminate 100, and other circuits are formed by conductor patterns in the laminate 100. DC-cutting capacitors, the high-frequency amplifier 60, the low-noise amplifier 61, etc. are mounted on the laminate 100. Semiconductor devices for the high-frequency amplifier 60, the low-noise amplifier 61, the high-frequency switch 40, etc., and chip devices such as capacitors, etc., which cannot be formed in the laminate 100, are mounted on an upper surface of the laminate 100, and sealed by a resin 120 as shown in FIG. 8.

Figure 10:
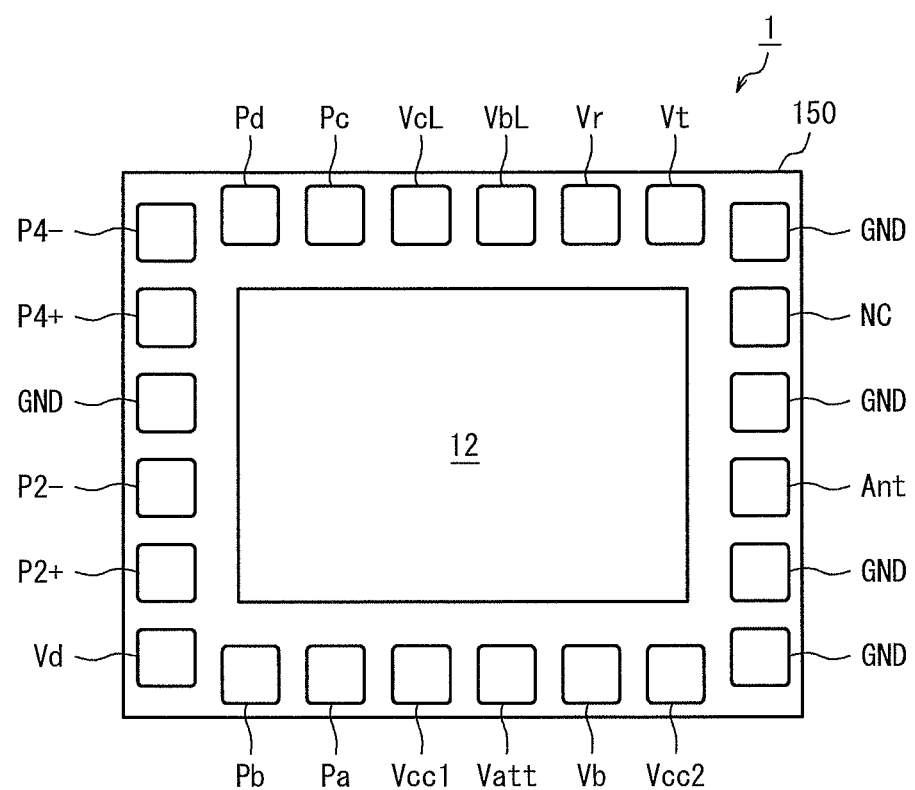
FIG. 10 is a plan view showing a lower surface of the electronic device according to another embodiment of the present invention.

FIG. 10 shows a lower surface of the electronic device 1. Formed on the lower surface are pluralities of terminal electrodes. A reference numeral assigned to each terminal electrode corresponds to that of each port in the equivalent circuit of the electronic device shown in FIG. 9. Formed in a center region of the lower surface is a third ground electrode 12 connected to the second ground electrode 10b through via-holes. The third ground electrode 12 provides stable ground potential, and improves connection strength to the circuit board.

Each terminal electrode is formed along each side of the third ground electrode 12. Formed along a first side (right side in FIG. 10) of the third ground electrode 12 are ground ports GND, an antenna port ANT and an unconnected port NC. Formed along a second side (lower side in FIG. 10) adjacent to the first side are voltage ports Vcc1, Vatt, Vb, Vcc2, an input port Pa of the filter 70, and an output port Pb of the balun 80. Formed along a third side (upper side in FIG. 10) opposing the second side are voltage-supplying terminals VcL, VbL, Vr, Vt, an output port Pc of the filter 72, and an input port Pd of the balun 82. Formed along a fourth side (left side in FIG. 10) opposing the first side are a voltage-supplying terminal Vd, a ground port GND, balanced input ports P2+, P2− of the balun 80, and balanced output ports P4+, P4− of the balun 82.

Figure 11:
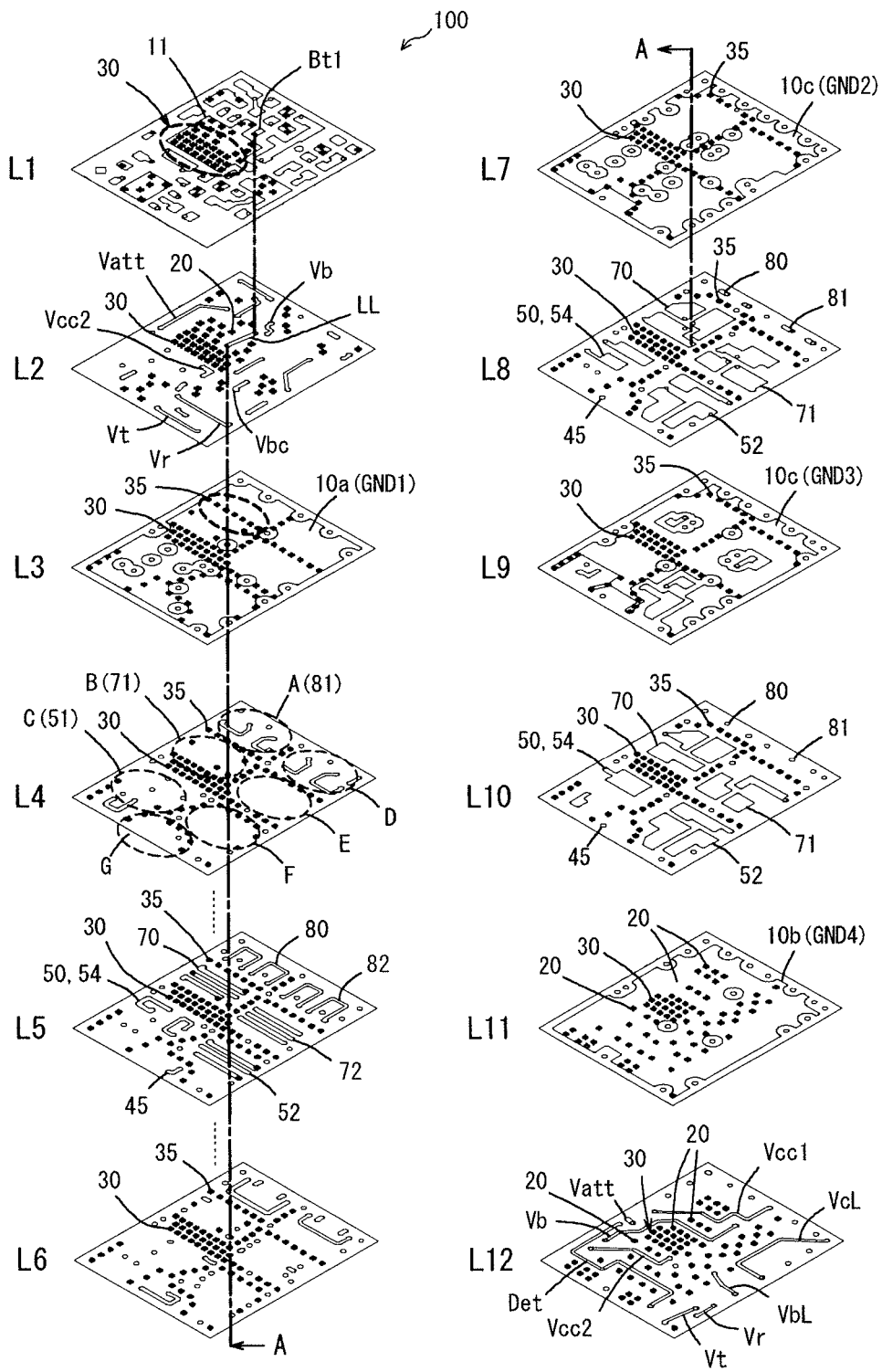
FIG. 11 is an exploded perspective view showing the internal structure of a laminate constituting the electronic device according to another embodiment of the present invention.

FIG. 11 schematically shows the arrangement of filters, baluns, etc. formed on insulator layers constituting the laminate 100. In the laminate 100 having 18 layers, layers between an insulator layer L4 and an insulator layer L5, and layers between an insulator layer L5 and an insulator layer L6 are not shown. The electronic device 1 comprises ground electrodes on different insulator layers L3, L7, L9, L11. Fourth ground electrodes 10c (GND2, GND3) are formed between the first ground electrode 10a (GND1) and the second ground electrode 10b (GND4). The ground electrodes GND1-GND4 are connected by shields constituted by linearly arranged via-holes, to partition the inside of the laminate 100 to seven regions A-G (shown on the insulator layer L4). In the figure, via-holes connected to the ground electrodes GND1-GND4 are shown by black circles, and other via-holes are shown by white circles.

On a mounting electrode 11 on an upper surface of the laminate 100 positioning above the region B, an amplifier-constituting semiconductor device 60 is mounted. Formed between the region B and the region C is a first shield 30 extending from the upper surface of the laminate 100 to the lower surface of the third ground electrode 12. Formed between the region A and the region B is a second shield 35.

Shields between other regions are also formed by via-holes 20 connecting the first ground electrode 10a to the second ground electrode 10b like the second shield 35, to function as electromagnetic partitions, and sub-heat-dissipating paths.

The first shield 30 is constituted by via-holes linearly arranged from the upper surface to lower surface of the laminate 1. Via-holes constituting the second shield 35 are different between the upper layer side and the lower layer side, with the fourth ground electrode 10c (GND2) formed on an insulator layer L7 as a boundary, via-holes on the upper layer side and those on the lower layer side being connected stepwise.

Conductor patterns for the balun 80 are formed in the region A, those for the filter 70 are in the region B, those for the filter 54 and the matching circuit 50 are in the region C, those for the balun 82 are in the region D, those for the filter 72 are in the region E, those for the filter 52 are in the region F, and those for the matching circuit 45 in the region G.

Conductor patterns for the filter 70 (the first circuit block) are formed in the region B. In FIG. 11, an insulator layer L5 is provided with conductor patterns for a resonator, and insulator layers L8, L10 are provided with conductor patterns for capacitance. One of conductor patterns for capacitance on the insulator layer L8 is connected to a conductor pattern LL on an insulator layer L2 through via-holes formed in insulator layers L2-L7. The conductor pattern LL is sandwiched by the mounting electrode 11 on the insulator layer L1 and the first ground electrode 10a on an insulator layer L3, and surrounded by via-holes connecting the insulator layer L1 to the first ground electrode 10a.

The conductor pattern LL formed on the insulator layer L2 is connected to a terminal electrode Bt1 formed on the insulator layer L1 through via-holes as shown by a chain line. The distance between the first circuit block 70 and the terminal electrode Bt1 is made shorter than that in a conventional structure, in which circuit blocks are disposed under an amplifier-constituting semiconductor device, resulting in reduced interference.

Power-supplying lines connected to the amplifier, etc., which are provided with the same reference numerals as those of the ports in FIG. 9) are formed on the insulator layers L2, L12 outside the first and second ground electrodes 10a, 10b. With pluralities of power-supplying lines separate from conductor patterns for circuit blocks in a lamination direction, they are freed from noise. To reduce interference, via-holes connected to the ground electrodes are disposed between the power-supplying lines.

Figure 12:
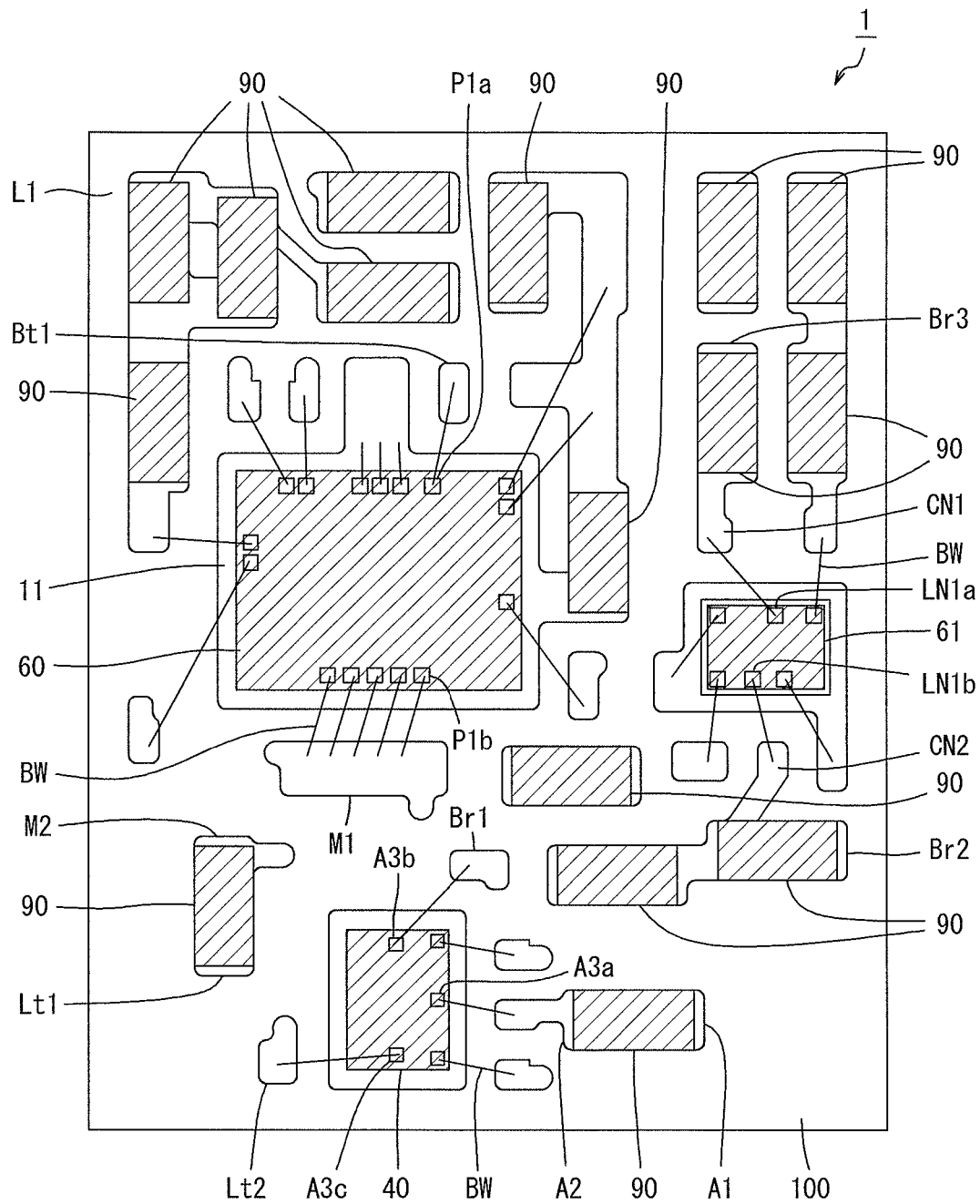
FIG. 12 is a plan view showing an upper surface of the electronic device according to another embodiment of the present invention.
Figure 13:
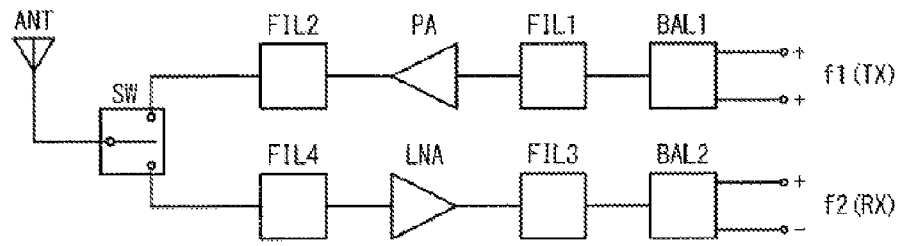
FIG. 13 is a block diagram showing a conventional high-frequency circuit for wireless communications apparatuses.
Figure 14:
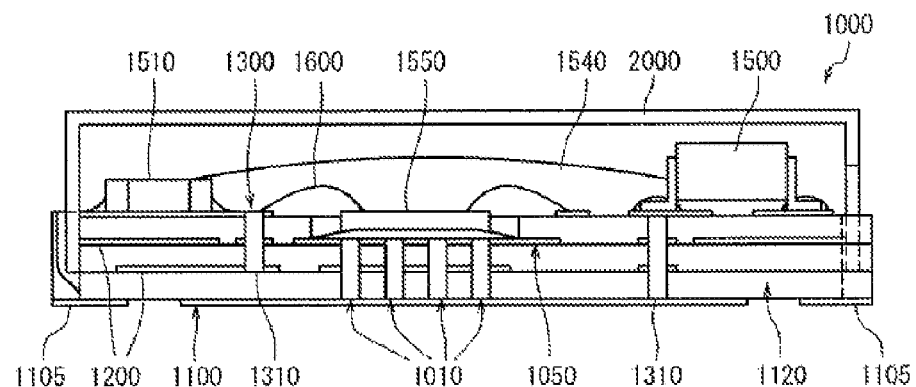
FIG. 14 is a cross-sectional view showing the internal structure of a hybrid integrated circuit device disclosed in JP 09-116091 A.
Figure 15:
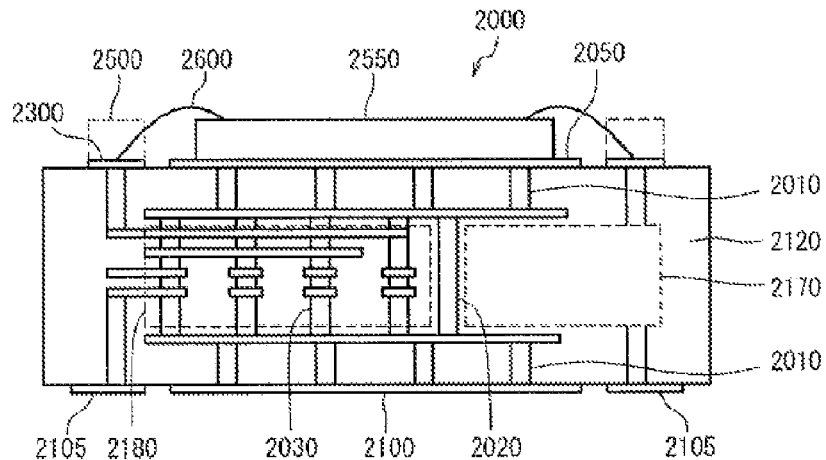
FIG. 15 is a cross-sectional view showing the internal structure of a high-frequency module disclosed in JP 2009-182903 A.

FIG. 12 shows the arrangement of terminal electrodes on an upper surface of the laminate and parts mounted thereon. The reference numerals of main devices shown in FIG. 12 correspond to those of ports in the equivalent circuit shown in FIG. 9. The port Bt1 of the filter 70, the ports M1, M2 of the matching circuit 50, the ports Lt1, Lt2 of the filter 54, the port A1 of the matching circuit 45, the port Br3 of the filter 72, and ports Br1, Br2 of the filter 52, which are respectively formed by conductor patterns in the laminate, are connected to terminal electrodes formed on the upper surface of the laminate 100. Accordingly, the connection of circuit devices is made by bonding wires BW, which are used for connection to the mounted chip devices and semiconductor devices such as amplifiers, switches, etc.

As described above, the inside of the laminate is partitioned by pluralities of ground electrodes at different lamination positions and shields electrically connecting the ground electrodes, to pluralities of electromagnetically shielded regions, and conductor patterns constituting circuit blocks are formed in different regions, thereby preventing interference among the circuit blocks in the shielded regions. With such structure, even the laminate 100 comprising pluralities of circuit blocks can be made smaller, while preventing interference between the circuit blocks, and efficiently dissipating heat from the semiconductors to the circuit board.

[3] Laminate

Insulator layers constituting the laminate 100 can be formed by dielectric ceramics, resins, or composite materials of resins and ceramics. Insulator layers provided with conductor patterns can be laminated by known methods. For example, when the insulator layers are made of dielectric ceramics, their lamination can be conducted by a low-temperature cofired ceramic (LTCC) technology or a high-temperature cofired ceramic (HTCC) technology. Also, when the insulator layers are made of resins, their lamination can be conducted by a build-up technology.

In the case of the LTCC technology, insulator layers of 10-200 μm in thickness made of dielectric ceramics sinterable at as low temperatures as 1000° C. or lower are printed with a conductor paste of Ag, Cu, etc. to form pluralities of ceramic green sheets having predetermined conductor patterns, which are laminated and integrally sintered to form the laminate 100. The low-temperature-sinterable dielectric ceramics include, for example, (a) ceramics comprising Al, Si and Sr as main components, and Ti, Bi, Cu, Mn, Na, K, etc. as sub-components, (b) ceramics comprising Al, Mg, Si and Gd, and (c) ceramics comprising Al, Si, Zr and Mg.

Effects Of The Invention

The electronic device of the present invention comprising a laminate of insulator layers each provided with conductor patterns, and an amplifier-constituting semiconductor device mounted on a mounting electrode on an upper surface of the laminate comprises conductor patterns constituting a first circuit block in a region below the amplifier-constituting semiconductor device between a first ground electrode on an insulator layer near an upper surface of the laminate and a second ground electrode on an insulator layer near a lower surface of the laminate, at least part of a conductor pattern for a line connecting the first circuit block to the amplifier-constituting semiconductor device being disposed on an insulator layer sandwiched by the mounting electrode and the first ground electrode, so that lines connecting the first circuit block to the amplifier-constituting semiconductor device are protected from interference by electromagnetic shielding. Accordingly, the electronic device of the present invention has excellent performance with a small size.

What is claimed is:

1. An electronic device comprising:
a laminate comprising pluralities of insulator layers each provided with conductor patterns, and an amplifier-constituting semiconductor device mounted to a mounting electrode formed on an upper surface of said laminate,
a first ground electrode being formed on an insulator layer near an upper surface of said laminate;
a second ground electrode being formed on an insulator layer near a lower surface of said laminate;
said first ground electrode being connected to said mounting electrode through pluralities of via-holes;
conductor patterns constituting a first circuit block being disposed in a region below said amplifier-constituting semiconductor device between said first ground electrode and said second ground electrode, and
at least part of a conductor pattern for a line connecting said first circuit block to said amplifier-constituting semiconductor device being disposed on an insulator layer sandwiched by said mounting electrode and said first ground electrode, the at least part of the conductor pattern overlapping the mounting electrode and the first ground electrode in a lamination direction.

2. The electronic device according to claim 1, wherein the at least part of said conductor pattern for the connecting line is a stripline connected to a via-hole connected to an output end of said first circuit block and a via-hole connected to a terminal electrode of the amplifier-constituting semiconductor device.

3. The electronic device according to claim 1, wherein said via-holes are formed around said conductor pattern for the connecting line.

4. The electronic device according to claim 1, wherein conductor patterns for power-supplying lines connected to said amplifier-constituting semiconductor device are formed on at least one of an insulator layer above said first ground electrode and an insulator layer below said second ground electrode.

5. The electronic device according to claim 1, wherein said laminate has a third ground electrode on the lower surface, said third ground electrode being connected to said second ground electrode through pluralities of via-holes.

6. The electronic device according to claim 1, wherein insulator layers between said mounting electrode and said third ground electrode in said laminate are provided with pluralities of via-holes connected in a lamination direction and arranged linearly in an in-plane direction; and wherein the inside of said laminate between said first ground electrode and said second ground electrode is partitioned to at least two regions by a shield constituted by said via-holes arranged linearly.

7. The electronic device according to claim 1, wherein said at least part of the conductor pattern is directly between said mounting electrode and first ground electrode.

* * * * *